(12) United States Patent
Yamamoto

(10) Patent No.: US 9,751,809 B2
(45) Date of Patent: Sep. 5, 2017

(54) HARD COATING HAVING EXCELLENT ADHESION RESISTANCE TO SOFT METAL

(71) Applicant: KOBE STEEL, LTD., Kobe-shi (JP)

(72) Inventor: Kenji Yamamoto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 56 days.

(21) Appl. No.: 14/443,243

(22) PCT Filed: Dec. 17, 2013

(86) PCT No.: PCT/JP2013/083787
§ 371 (c)(1),
(2) Date: May 15, 2015

(87) PCT Pub. No.: WO2014/098091
PCT Pub. Date: Jun. 26, 2014

(65) Prior Publication Data
US 2015/0336851 A1 Nov. 26, 2015

(30) Foreign Application Priority Data
Dec. 21, 2012 (JP) ................................ 2012-279768

(51) Int. Cl.
*C23C 14/06* (2006.01)
*C04B 35/581* (2006.01)
(Continued)

(52) U.S. Cl.
CPC ............ *C04B 35/581* (2013.01); *B21D 37/01* (2013.01); *C04B 35/58007* (2013.01);
(Continued)

(58) Field of Classification Search
USPC .................................. 428/697, 698, 699, 701
See application file for complete search history.

(56) References Cited

U.S. PATENT DOCUMENTS

| 5,246,787 A | * | 9/1993 | Schulz ................... A61B 17/00 |
| | | | 428/469 |
| 5,981,049 A | | 11/1999 | Ohara et al. |
| | | | (Continued) |

FOREIGN PATENT DOCUMENTS

| EP | 2 402 476 A1 | 1/2012 |
| JP | 08-199338 | * 8/1996 |
| | (Continued) | |

OTHER PUBLICATIONS

International Search Report and Written Opinion of the International Searching Authority Issued Mar. 25, 2014 in PCT/JP2013/083787 Filed Dec. 17, 2013.

(Continued)

*Primary Examiner* — Archene Turner
(74) *Attorney, Agent, or Firm* — Oblon, McClelland, Maier & Neustadt, L.L.P.

(57) ABSTRACT

Provided is a hard coating film which is hardly adhered to a soft metal and is suitable for the coating of, for example, the surface of a hot pressing mold that may be in contact with the soft metal. The hard coating film is characterized in that, on the surface of the hard coating film, the arithmetic average roughness (Ra) is 0.05 μm or less and the average number of pin holes each having an equivalent circle diameter of 1 μm or more is 5 or less per field when at least five fields each having a size of 45×65 μm are observed on a scanning electron microscope at 2000-fold magnification.

7 Claims, 2 Drawing Sheets

(51) Int. Cl.
C04B 35/58 (2006.01)
B21D 37/01 (2006.01)
B21D 22/02 (2006.01)
(52) U.S. Cl.
CPC .... *C04B 35/58014* (2013.01); *C23C 14/0641* (2013.01); *B21D 22/022* (2013.01); *Y10T 428/24355* (2015.01)

(56) References Cited

U.S. PATENT DOCUMENTS

| | | | |
|---|---|---|---|
| 6,033,768 A | * | 3/2000 | Muenz ................ C23C 14/0641 428/697 |
| 7,592,061 B1 | | 9/2009 | Yamamoto |
| 2006/0068225 A1 | | 3/2006 | Yamamoto |
| 2007/0172694 A1 | | 7/2007 | Yamamoto |
| 2011/0314991 A1 | | 12/2011 | Yamamoto et al. |
| 2012/0131980 A1 | | 5/2012 | Yamamoto |

FOREIGN PATENT DOCUMENTS

| | | |
|---|---|---|
| JP | 10-237628 A | 9/1998 |
| JP | 2002 30413 | 1/2002 |
| JP | 2004-99966 A | 4/2004 |
| JP | 2007-191765 A | 8/2007 |
| JP | 2010-58135 A | 3/2010 |
| JP | 2010 99735 | 5/2010 |
| JP | 2010 284710 | 12/2010 |
| JP | 2012 11393 | 1/2012 |
| JP | 2012 31522 | 2/2012 |
| JP | 2012-115869 A | 6/2012 |

OTHER PUBLICATIONS

Extended European Search Report issued Jun. 22, 2016 in Patent Application No. 13864307.7.

* cited by examiner

HARD COATING HAVING EXCELLENT ADHESION RESISTANCE TO SOFT METAL

TECHNICAL FIELD

The present invention relates to a hard coating having excellent adhesion resistance to a soft metal.

BACKGROUND ART

When materials having a surface containing soft metals, such as Zn, e.g., a galvanized steel plate, are processed or caused to slide, there is a problem in that the soft metal adheres and further is deposited on the surface of a member (e.g., a die or the like) contacting the soft metal, so that the surface quality of the workpiece is impaired.

Specifically, a hot pressing method has the following problems, for example. The hot pressing (also referred to "die quenching") method is a technique including heating a steel plate (blank) to a temperature (usually 800 to 900° C.) in the austenite range, and then rapidly cooling and forming the same to a desired part shape with a water-cooled die. The processes from the heating of the steel plate to press processing are performed in the atmosphere from the viewpoint of cost. Therefore, in order to suppress the generation of scales due to oxidation of the steel plate, a plated steel plate, on the surface of which a plating layer mainly containing Al or Zn is formed, is frequently used as the steel plate. However, when the plated steel plate is used, particularly a galvanized steel plate is used, the number of shots increases and also Zn adheres to a pressing die, so that the die shape is deformed in an extreme case, which poses a problem in the product shape and the surface quality of the formed steel plate.

In general, a ceramic coating, such as TiN, is formed as a coating on the surface of a hot pressing die as a measure against abrasion due to rubbing with the steel plate. However, even in this case, it is hard to say that the adhesion resistance to the soft metal is sufficient.

SUMMARY OF INVENTION

Technical Problem

The present invention has been made in view of the above-described circumstances and aims at realizing a hard coating which is hard to adhere to the soft metal mentioned above and a hard-coating coated member, on the surface of which the hard coating is formed.

Hereinafter, a description is given taking, as an example, a case where the hard coating of the present invention is applied to the surface of a jig or tool (particularly a die) as a hard-coating coated member. However, the present invention is not limited thereto and also includes a case where the present invention is applied to a sliding member or the like as a hard-coating coated member as described later.

Solution to Problem

The hard coating of the present invention having excellent adhesion resistance to a soft metal which has been able to solve the above-described problems has characteristics in that the surface arithmetic average roughness (Ra) is 0.05 µm or less and that the average number of pin holes having a circle equivalent diameter of 1 µm or more is 5 or less when the surface is observed using a scanning electron microscope for at least five fields each having a size of 45×65 µm at 2000-fold magnification.

As a preferable embodiment of the present invention, the hard coating contains metallic elements containing two or more elements selected from the group consisting of Ti, Al, Cr, and Si and one or more nonmetallic elements selected from the group consisting of C, N, and O.

Examples of the hard coating include (a) a hard coating in which the metallic elements contain Ti, Cr, and Al and the ratios (atomic ratio) thereof based on all the metallic elements are Ti: 0.10 or more and 0.40 or less, Cr: 0.10 or more and 0.40 or less, and Al: 0.40 or more and 0.70 or less and (b) a hard coating in which the metallic elements contain Ti, Cr, Al, and Si, and the ratios (atomic ratio) thereof based on all the metallic elements are Ti: 0.10 or more and 0.40 or less, Cr: 0.10 or more and 0.40 or less, Al: 0.40 or more and 0.70 or less, and Si: 0.010 or more and 0.10 or less.

The metallic elements may be partially replaced by one or more elements selected from the group consisting of Group IV elements, Group V elements, Group VI elements, Y, and B of a periodic table in a proportion of 20 at % in terms of the ratio based on all the metallic elements as the upper limit.

The hard coating is preferably one formed by a filtered arc ion plating method or an unbalanced magnetron sputtering method.

The present invention includes a hard-coating coated member (particularly a hot pressing die) having characteristics in that the hard coating is applied to the surface.

As a preferable embodiment of the present invention, the above-described hot pressing die is used for hot forming (particularly hot forming of a galvanized steel plate) of a material to be processed at least the surface of which contains one or more soft metals selected from the group consisting of Zn, Sn, Al, and Mg.

Advantageous Effects of Invention

The hard coating of the present invention has excellent adhesion resistance to a soft metal, such as Zn (hereinafter sometimes merely referred to as "adhesion resistance"). Therefore, when the hard coating of the present invention is formed on the surface of a die and a jig or tool (hereinafter collectively referred to as a "jig or tool") to be used for plastic processing, cutting processing, or machining processing, for example, adhesion of the soft metal to the surface of the jig or tool caused by contact of the jig or tool with the material to be processed having a surface containing the soft metal is suppressed. As a result, repeatedly the jig or tool can be used stably over a long period of time.

DESCRIPTION OF EMBODIMENTS

The present inventors have diligently conducted a research in order to solve the above-described problems. As a result, the present inventors have found that when the surface of the jig or tool contains a hard coating having a surface satisfying the following items (1) and (2), the adhesion of the soft metal to the surface of the jig or tool is markedly suppressed when the jig or tool contacts a soft metal, and then the present inventors have completed the present invention:

(1) The surface arithmetic average roughness (Ra) is 0.05 µm or less; and (2) The average number of pin holes having a circle equivalent diameter of 1 µm or more is 5 or less when at least five fields each having a size of 45×65 µm are observed using a scanning electron microscope for at 2000-fold magnification.

Hereinafter, the above items (1) and (2) are described in detail.

It is required that the hard coating on the surface of the jig or tool which directly contacts a soft metal has a reduced roughness as described in (1) above, i.e., the arithmetic average roughness (hereinafter referred to as "Ra" or "surface roughness") is suppressed to 0.05 µm or less. This is because, when the surface of the hard coating is rough, the adhesion of a soft metal occurs from the projection of roughness serving as the starting point. The Ra is preferably 0.02 µm or less and more preferably 0.01 µm or less.

The Ra is measured by a method described in Examples described later.

The adhesion of the soft metal is caused by not only the surface roughness but also pin holes, which are frequently observed in a vapor phase coating, serving as the starting point. As the mechanism, the soft metal is pressed into the pin holes in processing, so that adhesion occurs. The probability that the soft metal is pressed into the pin holes depends on the size of the pin holes. In the case of the pin holes having a diameter of about 1 µm or more, the pressing of the soft metal into the pin holes may arise.

As described in detail in Examples, the present invention has clarified that, when the surface of the hard coating is observed using a scanning electron microscope for at least five fields (the size of one field is 45×65 µm) at 2000-fold magnification, the adhesion is very hard to occur in the case where the number of pin holes having a circle equivalent diameter of 1 µm or more is 5 or less in terms of the average of the at least observed five fields (hereinafter, the average is sometimes simply referred to as "the number of pin holes"). The number of the pin holes is more preferably 3 or less and most preferably 1 or less.

Figure 1:
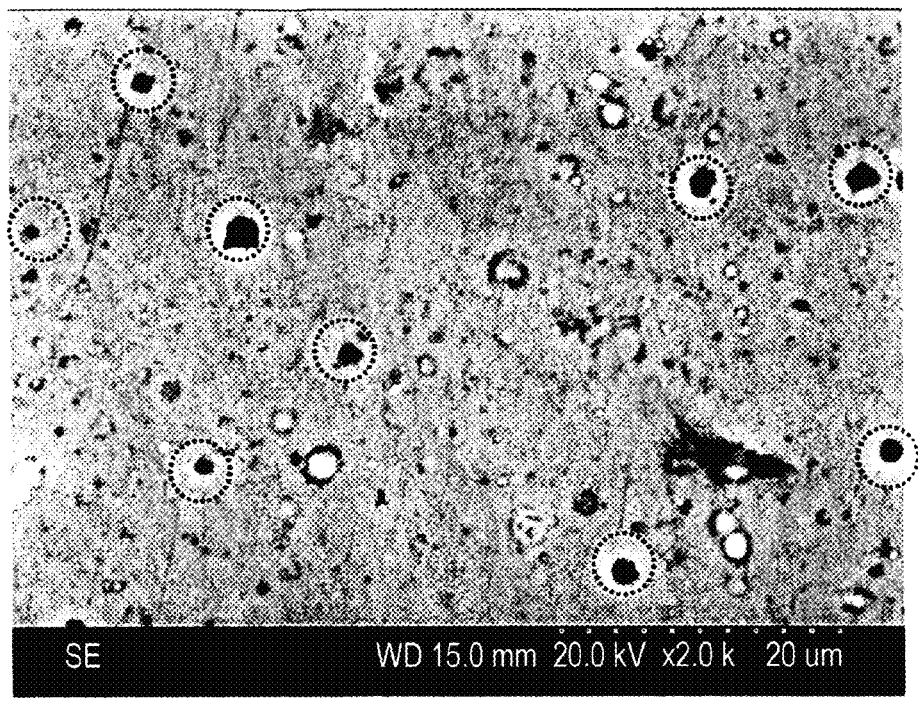
FIG. 1 is a scanning electron microscope (SEM) observation photograph of an example in which the number of pin holes is 9.
Figure 2:
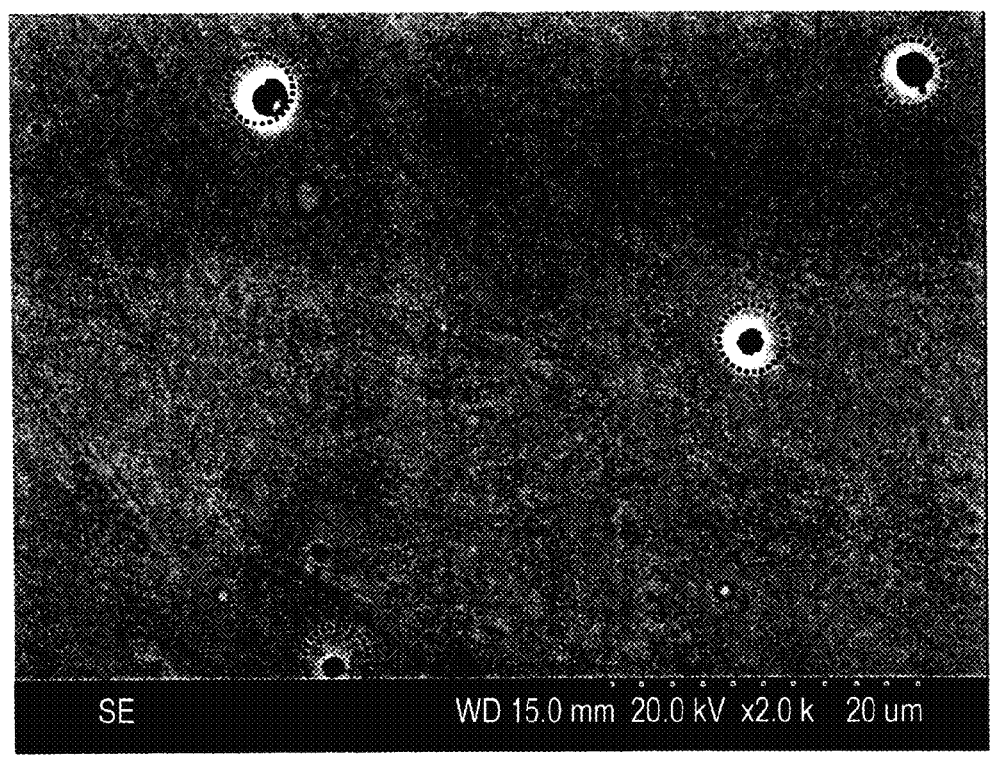
FIG. 2 is an SEM observation photograph of an example in which the number of pin holes is 4.
Figure 3:
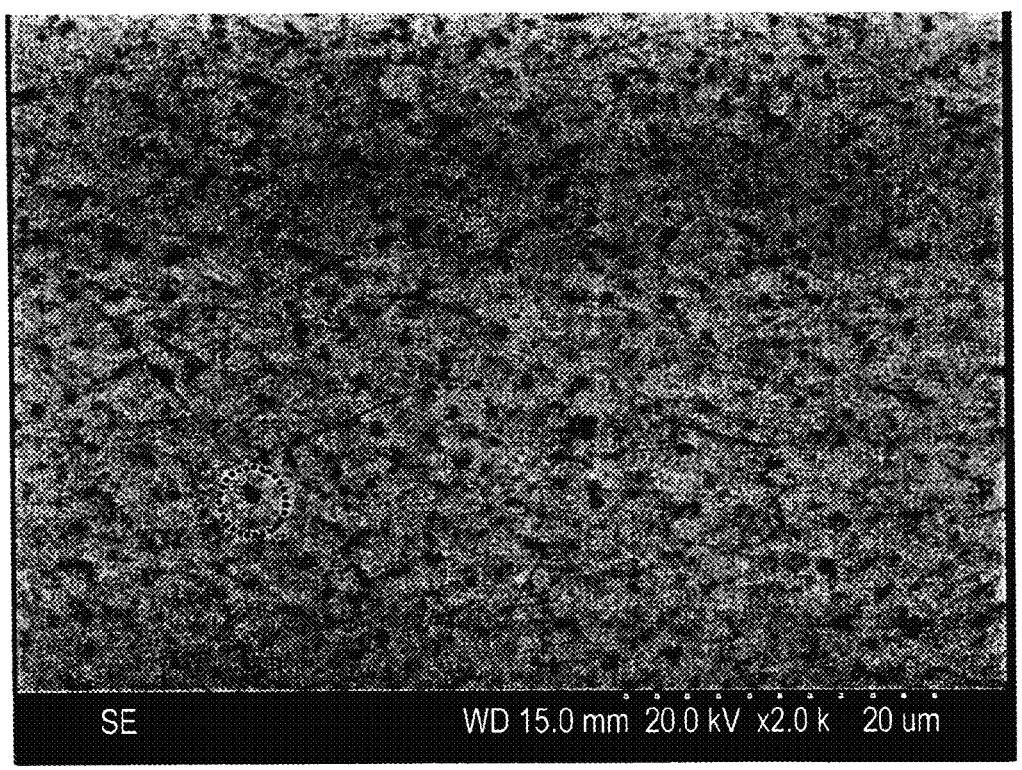
FIG. 3 is an SEM observation photograph of an example in which the number of pin holes is 1.

The observation examples (SEM observation photographs) are shown in FIGS. 1 to 3 (in the photographs, the pin holes having a circle equivalent diameter of 1 µm or more are circled). FIG. 1 shows an example in which the number of the pin holes of 1 µm or more is 9. FIG. 2 shows an example in which the number of the pin holes is 4. FIG. 3 shows an example in which the number of the pin holes is 1.

Next, preferable materials constituting the hard coating are described.

It is required, as the material quality, that the materials constituting the hard coating do not react and form a compound with a soft metal which the materials contact. In hot pressing, it is assumed that a die contacts a heated steel plate. In other processing (hot forging of Al or the like), it is assumed that the temperature increases due to heat generated by sliding. Therefore, it is preferable that the materials constituting the hard coating also have oxidation resistance and abrasion resistance.

Examples of the materials constituting the hard coating include compounds containing metallic elements containing one or more elements selected from the group consisting of Group IV elements, Group V elements, Group VI elements, Y, Al, and Si of a periodic table and one or more nonmetallic elements selected from the group consisting of C, N, and O.

From these viewpoints, specifically as the materials, compounds which contain metallic elements containing two or more elements selected from the group consisting of Ti, Al, Cr, and Si and one or more nonmetallic elements selected from the group consisting of C, N, and O are preferable.

As a combination of the metallic elements, TiAl, AlCr, TiCrAl, or TiCrAlSi is more preferable.

When the metallic element is TiCrAl, the ratios (atomic ratio) of the metallic elements based on all the metallic elements are preferably set in the ranges of Ti: 0.10 or more and 0.40 or less, Cr: 0.10 or more and 0.40 or less, and Al: 0.40 or more and 0.70 or less. When the metallic element is TiCrAlSi, the ratios (atomic ratio) of the metallic elements based on all the metallic elements are preferably set in the ranges of Ti: 0.10 or more and 0.40 or less, Cr: 0.10 or more and 0.40 or less, Al: 0.40 or more and 0.70 or less, and Si: 0.010 or more and 0.10 or less.

Among the hard coatings, TiAlN, AlCrN, TiCrAlN, and TiCrAlSiN are particularly preferable from the viewpoint of abrasion resistance and oxidation resistance.

The hard coating of the present invention may be one in which the metallic elements are partially replaced by one or more elements (hereinafter sometimes referred to as "X group elements") selected from the group consisting of Group IV elements, Group V elements, Group VI elements, Y, and B of a periodic table in a proportion of 20 at % (0.20 in terms of atomic ratio) in terms of the ratio based on all the metallic elements as the upper limit. When the X group elements are contained, the amount of the X group elements can be set to 1 at % or more, for example. The adhesion resistance does not decrease due to the replacement.

Among the X group elements, Ta, Nb, W, Y, and B are more preferable and Y and B are still more preferable.

(Method for Forming Hard Coating)

In order to obtain a hard coating in which the surface properties satisfy the above-described requirements, it is recommended to produce the hard coating by the following method.

In order to form the hard coating in which the number of the pin holes is suppressed, a filtered arc ion plating method or a sputtering method is preferable among vapor phase coating methods. In particular, the sputtering method (particularly, an Unbalanced Magnetron Sputtering, UBMS method) is useful for the formation of a hard coating having more excellent adhesion resistance because particles serving as the starting point of pin holes are not generated in principle. For the conditions when a coating is formed by each method described above, general conditions may be adopted. Any method described above includes, for example, forming the hard coating of the present invention using a target containing the metallic elements mentioned above (further the X group elements as necessary) of the hard coating and using nitrogen gas, hydrocarbon gas such as methane, oxygen gas, Ar gas, or the like as an atmospheric gas.

In the case of the filtered arc ion plating method, the coating conditions are set as follows, for example: Base material temperature: 300 to 700° C., Bias voltage: −30 to −70 V (the minus indication of the bias voltage means that the base material has a minus potential to the ground potential, which similarly applies to the following description), and Total gas pressure: 1 to 5 Pa. In the case of the sputtering method, the coating conditions are set as follows, for example: Base material temperature: 300 to 700° C., Supply power: 3 kW, for example (when the target diameter is 6 inches), and Total gas pressure: 0.6 Pa, for example.

In order to achieve the above-described arithmetic average roughness (Ra), after forming the hard coating, it is recommended to polish the surface of the hard coating. As methods for polishing the hard coating, not only projection type polishing but electrolytic polishing, buff polishing, and the like are mentioned. Furthermore, since the Ra of the hard coating is affected by the surface properties of the base material, it is recommended to polish the surface of the base material before the formation of the hard coating until the Ra reaches 0.05 μm or less. As methods for polishing the base material surface, electrolytic polishing, buff polishing, chemical polishing, and the like are mentioned, for example.

The hard coating of the present invention in which the surface properties are controlled as described above has excellent adhesion resistance to a soft metal. Therefore, when the hard coating of the present invention is applied to the surface of a jig or tool to be used for processing (particularly hot processing) of a material to be processed in which at least the surface contains soft metals (Zn or the like), the adhesion resistance is sufficiently demonstrated. As the soft metals, pure metals and alloys containing one or more elements selected from the group consisting of Zn, Sn, Al, and Mg are mentioned.

As the "material to be processed in which at least the surface contains soft metals (Zn or the like)", not only metal plates (for example, a steel plate) in which a plating layer containing one or more elements selected from the group consisting of Zn, Sn Al, and Mg is formed but pure Al, Al-based alloys, pure Sn, Sn-based alloys, pure Zn, Zn-based alloys, Mg-based alloys, and the like are mentioned. When particularly galvanized steel plates (including a hot-dip galvanized steel plate (GI), an alloyed hot-dip galvanized steel plate (GA), and an electrogalvanized steel plate (EG)) are used as the material to be processed, the effects of the present invention are sufficiently demonstrated.

As processing methods using materials to be processed other than the plated steel plates mentioned above, forging of Al-based metals, Al die casting, Zn die casting, Mg die casting, and the like are mentioned, for example.

As the hard-coating coated member of the present invention, dies (including dies, punches, pads, and the like) for use in press forming (particularly hot pressing), forging processing, extrusion forming, and the like, jigs or tools (including cutting tools, such as a chip, a drill, and an end mill, blanking punches, and the like), sliding members in automobile parts and machine parts, and the like are mentioned.

In the hard-coating coated member (particularly hot pressing die) of the present invention, at least a contact portion with a soft metal is desired to be coated with the hard coating of the present invention and a non-contact portion with a soft metal is not necessarily coated.

The hard coating of the present invention is optimal for coating a die (hot pressing die) to be used in hot pressing in which a galvanized steel plate, which is particularly likely to cause adhesion, is used as a material to be processed.

The thickness of the hard coating of the present invention is preferably 0.5 μm or more. This is because when the thickness is less than 0.5 μm, the coating is not sufficient, so that the base material may be exposed. The thickness is more preferably 1 μm or more. On the other hand, when the thickness of the hard coating is excessively high, separation is likely to occur. Therefore, the thickness of the hard coating is preferably 10 μm or less. The thickness of the hard coating is more preferably 5 μm or less.

In the hard-coating coated member, it is only required that the outermost surface contains the hard coating of the present invention and a hard coating other than the hard coating specified by the present invention or an intermediate layer of CrN, TiN, and the like may be formed between the hard coating on the outermost surface and the base material.

This application claims the benefit of Japanese Patent Application No. 2012-279768 filed Dec. 21, 2012. The entire content of the specification of Japanese Patent Application No. 2012-279768 filed Dec. 21, 2012 is incorporated for reference of this application.

EXAMPLES

Hereinafter, the present invention is more specifically described with reference to Examples but it is a matter of course that the present invention is not limited by the following Examples, the present invention can be implemented while being modified as appropriate in the range where the modifications can be fit to the meaning of the description before and after the modifications, and the modifications are all included in the technical scope of the present invention.

Example 1

In Example 1, the influence of the presence or absence, the surface roughness, and the number of pin holes of a hard coating on the adhesion amount of a soft metal was confirmed.

As a base material, mirror-finished base materials (SKD11 and HRC60 which are alloy tool steels of the JIS standard, Ra of base material=0.005 μm) were prepared for evaluating the surface properties of a coating. Separately, a mirror-finished bending die (SKD61 which is an alloy tool steel of the JIS standard, Ra of base material=0.005 μm) was prepared for evaluating adhesion resistance to a soft metal.

Then, coatings shown in Table 1 were formed with about 3 μm on the surface of each of the base materials by an Arc Ion Plating method (indicated as "AIP" in Table 1), a filtered arc ion plating method (indicated as "Filtered AIP" in Table 1), or an unbalanced magnetron sputtering method (indicated as "UBMS" in Table 1) as shown in Table 1.

The coating conditions of the arc ion plating method (AIP method) were set as follows: Base material temperature: 400° C., Total gas pressure: 4 Pa, and Bias voltage: −70 V. The coating conditions of the filtered arc ion plating method (Filtered AIP method) were set as follows: Base material temperature: 400° C., Total gas pressure: 4 Pa, and Bias voltage: −70 V. The coating conditions of the unbalanced magnetron sputtering method (UBMS method) were set as follows: Base material temperature: 400° C., Total gas pressure: 0.6 Pa, and Supply power: 3 kW (Target diameter of 6 inches). In any method, a TiCrAlSi target of the composition shown in Table 1 was used as the target and a pure nitrogen gas was used as an atmospheric gas in the AIP method and the Filtered AIP method. In the UBMS method, a mixed gas of nitrogen:Ar(volume ratio)=45:55 was used.

A sample on which a coating was not formed was also prepared (No. 1 of Table 1).

Then, after forming the coating, the coating surface was polished using a projection type polishing device (AERO LAP (Registered Trademark), manufactured by Yamashita Works Co., Ltd.) to produce samples different in Ra as shown in Table 1. By changing the polishing time, samples having the same composition component produced by the same coating method and different in Ra were produced. A sample on which a coating was formed but which was not polished was also prepared (No. 2 of Table 1).

Using these samples, evaluation of the surface properties of the coating (measurement of Ra and the number of pin holes) and evaluation of the adhesion resistance were performed as follows.

(Measurement of Surface Roughness (Ra))

The Ra of each sample was measured using a stylus type surface roughness meter (DekTak6M). In the present invention, the Ra was calculated from a roughness curve obtained by removing a surge from the surface curve measured while setting the scanning length to 1 μm and the number of measurement points in the horizontal direction to 3900 points. In the calculation of the Ra, the measurement was performed at arbitrary 5 places on the surface of the coating, and the average was adopted. The case where the average (Ra) was 0.05 μm or less was regarded as acceptable. No. 1 of Table 1 is an example in which a coating was not formed and Ra in Table 1 is a value obtained by measuring the surface roughness of the base material for reference.

(Measurement of Number of Pinholes)

The surface of the coatings was observed using a scanning electron microscope (manufactured by Hitachi, accelerating voltage of 20 kV, magnification of 2000 times, field size of 45×65 μm), and pin holes having a circle equivalent diameter of 1 μm or more were counted. This measurement was performed at arbitrarily selected five fields per sample, and then the average of the number of the pin holes was calculated.

Then, the case where the average (the average number of the pin holes within 1 field) of the number of the pin holes was 5 or less was regarded as acceptable.

(Evaluation of Adhesion Resistance to Soft Metal)

Zn was selected as a typical soft metal and an alloyed hot-dip galvanized (GA) steel plate (galvanized steel plate) was prepared as a plate material (blank). Then, the heated galvanized steel plate was bended under the following forming conditions using a bending die having the coating and a bending die not having the coating, and then the Zn adhesion to the die surface after processing was investigated.

(Forming Conditions)

Plate material (blank): Alloyed hot-dip galvanized (GA) steel plate (Tensile Strength of 590 MPa, Plate Thickness of 1.4 μm)

Die material: SKD61 material which is an alloy tool steel of the JIS standard+Various coatings shown in Table 1

Pressing load: 1 t

Heating temperature: 760° C.

Then, the Zn adhesion state (the adhesion amount) was classified into 5 grades as shown in the following evaluation criteria and the samples of Grade 3 or less were evaluated to be excellent in adhesion resistance.

(Evaluation Criteria)

In the contact surface of the die with the plate material, the ratio (%) of the Zn adhesion area was determined, and then evaluated according to the following scale of 0 to 5.

5: More than 60%
4: More than 30% and 60% or less
3: More than 20% and 30% or less
2: More than 10% and 20% or less
1: More than 5% and 10% or less
0: 5% or less These results are shown in Table 1.

TABLE 1

| No. | Coating* | Coating method | Polishing after coating | Surface roughness Ra (μm) | Number of pin holes (pieces) | Adhesion amount |
|---|---|---|---|---|---|---|
| 1 | None | None | — | 0.005 | — | 5 |
| 2 | TiCrAlSiN | AIP | Not done | 0.1 | 10 or more | 5 |
| 3 | TiCrAlSiN | AIP | Done | 0.07 | 10 or more | 4 |
| 4 | TiCrAlSiN | AIP | Done | 0.03 | 10 or more | 4 |
| 5 | TiCrAlSiN | Filtered AIP | Done | 0.03 | 2.8 | 2 |
| 6 | TiCrAlSiN | Filtered AIP | Done | 0.01 | 2.8 | 1 |
| 7 | TiCrAlSiN | UBMS | Done | 0.005 | 0.8 | 0 |
| 8 | TiCrAlSiN | UBMS | Done | 0.005 | 0.2 | 0 |

*TiCrAlSiN = (Ti0.20Cr0.20Al0.55Si0.05)N (Numerical values indicate the atomic ratio.)

Table 1 shows the following facts. Since the coating was not formed on the die surface in No. 1, the adhesion amount of the soft metal was markedly large. Although the coating was formed in No. 2, the Ra was quite high and the number of the pin holes was also excessively large, and therefore the adhesion amount of the soft metal was markedly large.

Although the coating was formed in No. 3, the Ra deviated from the upper limit specified by the present invention and the number of the pin holes was excessively large, and therefore the adhesion amount of the soft metal was large but was not so large as compared with the adhesion amount of No. 2.

Although the coating was formed in No. 4 and also the Ra was within the range specified by the present invention, the number of the pin holes was excessively large, and therefore the adhesion amount of the soft metal was large.

The comparison between No. 2, and No. 3 and No. 4 shows that it is good to sufficiently polish the coating in order to achieve a desired Ra.

On the other hand, it is found that, in No. 5 to No. 8, the hard coatings in which both the Ra and the number of the pin holes were within the range specified by the present invention were formed as the coating, and the adhesion amount of the soft metal is sufficiently suppressed when using a die in which the hard coating was formed on the surface.

In particular, the comparison between No. 3 and No. 4, and No. 5 to No. 8 shows that it is preferable to adopt the filtered arc ion plating method or the sputtering method as the coating method in order to achieve a desired number of the pin holes. The comparison between No. 5 and No. 6, and No. 7 and No. 8 shows that, when particularly the sputtering method (UBMS method) among the methods above is adopted, hard coatings in which the number of the pin holes is sufficiently suppressed and the Ra is sufficiently small are obtained as the coating and the adhesion amount of the soft metal can be sufficiently suppressed.

Example 2

In Example 2, coatings of various component compositions were formed, and then the adhesion resistance to a soft metal was evaluated.

More specifically, coatings of the various component compositions shown in Table 2 were formed by the coating methods shown in Table 2, and then polished to obtain samples having the Ra shown in Table 2. For the coating, targets containing metallic elements (further the X group elements) of the coatings shown in Table 2 were used. In No. 1 to No. 6 and No. 10 to No. 14, a pure nitrogen gas was used as an atmospheric gas. In No. 7, hydrocarbon gas was used in addition to nitrogen gas as an atmospheric gas. In No. 8, nitrogen gas, hydrocarbon gas, and oxygen gas were used as an atmospheric gas. In No. 9, a mixed gas of Ar gas and nitrogen gas was used. The sample production conditions including the other coating conditions are the same as those of Example 1.

Using the obtained samples, evaluation of the surface properties (measurement of the Ra and the number of the pin holes) and evaluation of the adhesion resistance were performed in the same manner as in Example 1. The results are shown in Table 2.

No. 10 to No. 14 are examples in which two or more metallic elements selected from the group consisting of Ti, Al, Cr, and Si in the hard coatings were partially replaced by the X group elements. It is found that also when these coatings are applied, the adhesion amount is suppressed.

TABLE 2

| No. | Coating* | Coating method | Polishing after coating | Surface roughness Ra (μm) | Number of pinholes (pieces) | Adhesion amount |
|---|---|---|---|---|---|---|
| 1 | TiN | Filtered AIP | Done | 0.01 | 2.3 | 3 |
| 2 | VN | Filtered AIP | Done | 0.01 | 2.4 | 3 |
| 3 | (Ti0.50Al0.50)N | Filtered AIP | Done | 0.01 | 1.5 | 2 |
| 4 | (Al0.50Cr0.50)N | Filtered AIP | Done | 0.01 | 3 | 2 |
| 5 | (Ti0.20Cr0.20Al0.60)N | Filtered AIP | Done | 0.01 | 2.1 | 1 |
| 6 | (Ti0.20Cr0.20Al0.55Si0.05)N | Filtered AIP | Done | 0.01 | 1.8 | 1 |
| 7 | (Ti0.20Cr0.20Al0.60)0.50C0.10N0.40 | Filtered AIP | Done | 0.01 | 2.3 | 1 |
| 8 | (Ti0.20Cr0.20Al0.60)0.50C0.10N0.30O0.10 | Filtered AIP | Done | 0.01 | 1.5 | 2 |
| 9 | (Ti0.20Cr0.20Al0.55Si0.05)N | UBMS | Done | 0.005 | 0.5 | 0 |
| 10 | (Ti0.35Al0.50Ta0.15)N | Filtered AIP | Done | 0.01 | 2.6 | 2 |
| 11 | (Ti0.35Al0.50Nb0.15)N | Filtered AIP | Done | 0.015 | 3 | 2 |
| 12 | (Ti0.40Al0.50W0.10)N | Filtered AIP | Done | 0.02 | 2.6 | 2 |
| 13 | (Ti0.20Cr0.20Al0.50B0.10)N | Filtered AIP | Done | 0.008 | 1.5 | 1 |
| 14 | (Ti0.20Cr0.20Al0.55Si0.03Y0.02)N | Filtered AIP | Done | 0.01 | 1.5 | 1 |

*(Numerical values indicate the atomic ratio.)

Table 2 shows the following facts. All the coatings of No. 1 to No. 14 satisfy the Ra and the number of the pin holes specified by the present invention and the adhesion amount is suppressed.

The comparison between No. 1 and No. 2, and No. 3 to No. 14 shows that when the metallic elements in the component of the hard coatings preferably contain two or more elements selected from the group consisting of Ti, Al, Cr, and Si, the adhesion amount can be sufficiently suppressed.

When No. 6 and No. 9 are compared, it is found that these samples are examples in which coatings of the same component composition were formed, and when the coatings were formed by the sputtering method (UBMS method) as in No. 9, the surface roughness is small, the number of the pin holes is small, and the adhesion resistance is markedly excellent.

The invention claimed is:

1. A hard coating having excellent adhesion resistance to a soft metal, comprising:
   metallic elements containing at least two elements selected from the group consisting of Ti, Cr, Al, and Si, and at least one nonmetallic elements selected from the group consisting of C, N, and O,
   wherein
   the metallic elements contain Ti, Cr, and Al, and atomic ratios of the metallic elements based on all the metallic elements satisfy Ti: 0.10 or more and 0.40 or less, Cr: 0.10 or more and 0.40 or less, and Al: 0.40 or more and 0.70 or less,
   the metallic elements are partially replaced by at least one element selected from the group consisting of Group IV elements, Group V elements, and Y of the periodic table in a proportion of 20 at. % or less in terms of a ratio based on all the metallic elements, and
   an arithmetic average roughness (Ra) of a surface is 0.05 μm or less and an average number of pin holes having a circle equivalent diameter of 1 μm or more is 5 or less when the surface is observed using a scanning electron microscope for at least five fields each having a size of 45×65 μm at 2000-fold magnification.

2. The hard coating according to claim 1, which is formed by a filtered arc ion plating method or an unbalanced magnetron sputtering method.

3. A hard-coating coated member, comprising:
   the hard coating according to claim 1 coating a surface of the member.

4. A hot pressing die, comprising:
the hard coating according to claim 1 coating a surface of the die.

5. The hot pressing die according to claim 4, which is used for hot forming of a material to be processed at least a surface of which contains one or more soft metals selected from the group consisting of Zn, Sn, Al, and Mg.

6. The hot pressing die according to claim 4, which is used for hot forming of a galvanized steel plate.

7. A hard coating having excellent adhesion resistance to a soft metal, comprising:
metallic elements containing at least two elements selected from the group consisting of Ti, Cr, Al, and Si, and at least one nonmetallic elements selected from the group consisting of C, N, and O,
wherein
the metallic elements contain Ti, Cr, Al, and Si and atomic ratios of the metallic elements based on all the metallic elements satisfy Ti: 0.10 or more and 0.40 or less, Cr: 0.10 or more and 0.40 or less, Al: 0.40 or more and 0.70 or less, and Si: 0.010 or more and 0.10 or less,
the metallic elements are partially replaced by at least one element selected from the group consisting of Group IV elements, Group V elements, and Y of the periodic table in a proportion of 20 at. % or less in terms of a ratio based on all the metallic elements, and
an arithmetic average roughness (Ra) of a surface is 0.05 μm or less and an average number of pin holes having a circle equivalent diameter of 1 μm or more is 5 or less when the surface is observed using a scanning electron microscope for at least five fields each having a size of 45×65 μm at 2000-fold magnification.

* * * * *